US 6,622,711 B1

(12) United States Patent
Skinner et al.

(10) Patent No.: US 6,622,711 B1
(45) Date of Patent: Sep. 23, 2003

(54) IGNITION COIL CASSETTE ASSEMBLY

(75) Inventors: Albert Anthony Skinner, Anderson, IN (US); Raymond O. Butler, Jr., Anderson, IN (US); Douglas Lynn Sprunger, Middletown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/241,866

(22) Filed: Sep. 12, 2002

(51) Int. Cl.[7] ................................................ F02P 15/08
(52) U.S. Cl. ....................................... 123/634; 123/635
(58) Field of Search ............................... 123/634, 635, 123/594, 605

(56) References Cited

U.S. PATENT DOCUMENTS

| 5,109,828 | A | * | 5/1992 | Tagami et al. | ............... | 123/635 |
| 5,979,422 | A | * | 11/1999 | Flierl et al. | ................ | 123/647 |
| 6,463,919 | B1 | | 10/2002 | Skinner et al. | .............. | 123/634 |
| 6,543,430 | B2 | * | 4/2003 | Moga et al. | ................ | 123/634 |
| 6,557,538 | B2 | * | 5/2003 | Munz | ........................ | 123/635 |

* cited by examiner

Primary Examiner—Bibhu Mohanty
(74) Attorney, Agent, or Firm—Margaret A. Dobrowitsky

(57) ABSTRACT

A method of assembling an ignition coil cassette assembly for use with an internal combustion engine having a plurality of cylinder assemblies each including a spark plug, and an ignition coil cassette assembly provided in accordance with the invention methodology. The cassette assembly includes a plurality of ignition coils for respective electrical coupling to the respective spark plugs, whereby to deliver high voltage charges to the spark plugs in accordance with a predetermined firing order, a cassette body structure interconnecting and mounting the ignition coils in spaced downstanding relation with respect to the body, a printed circuit board for delivering power to the coils, and electronic components mounted on the board. A plurality of upwardly opening pockets are provided in the cassette body; the electronic components are positioned in the pockets; the ignition coils are positioned in the cassette body; the printed circuit board is positioned in overlying relation to the electronic components and upper ends of the ignition coils; and upstanding pins on the electronic components are soldered to the printed circuit board while simultaneously soldering upstanding pins on the upper ends of ignition coils to the printed circuit board.

9 Claims, 3 Drawing Sheets

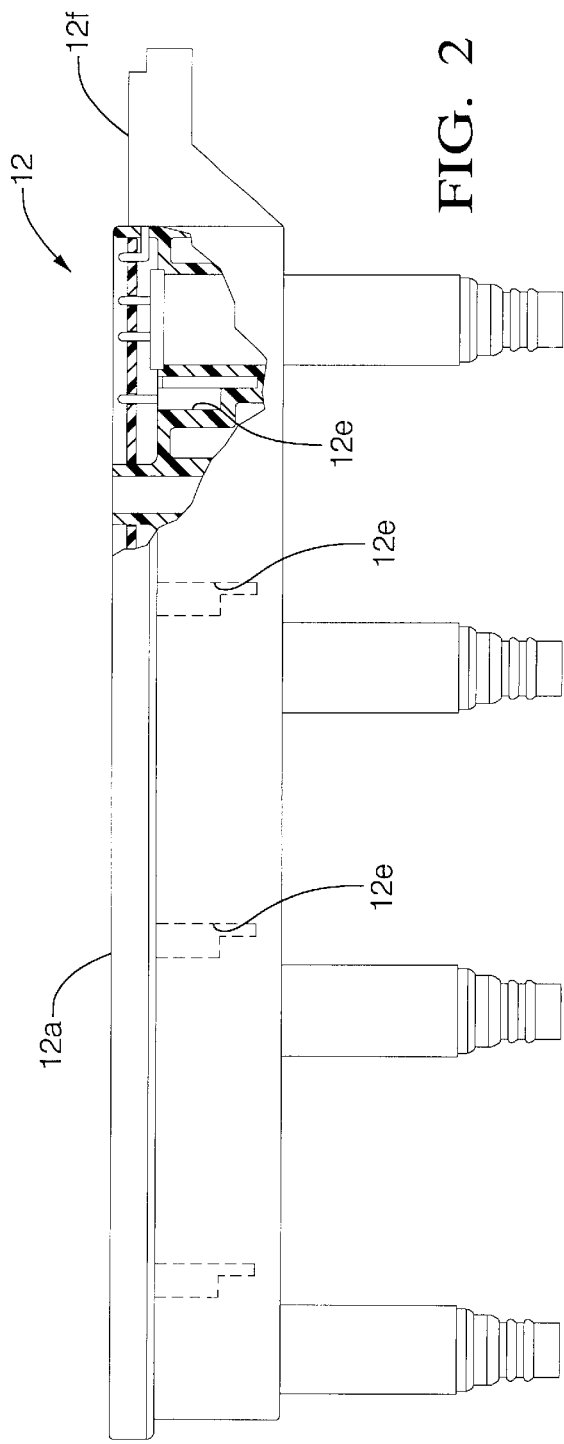
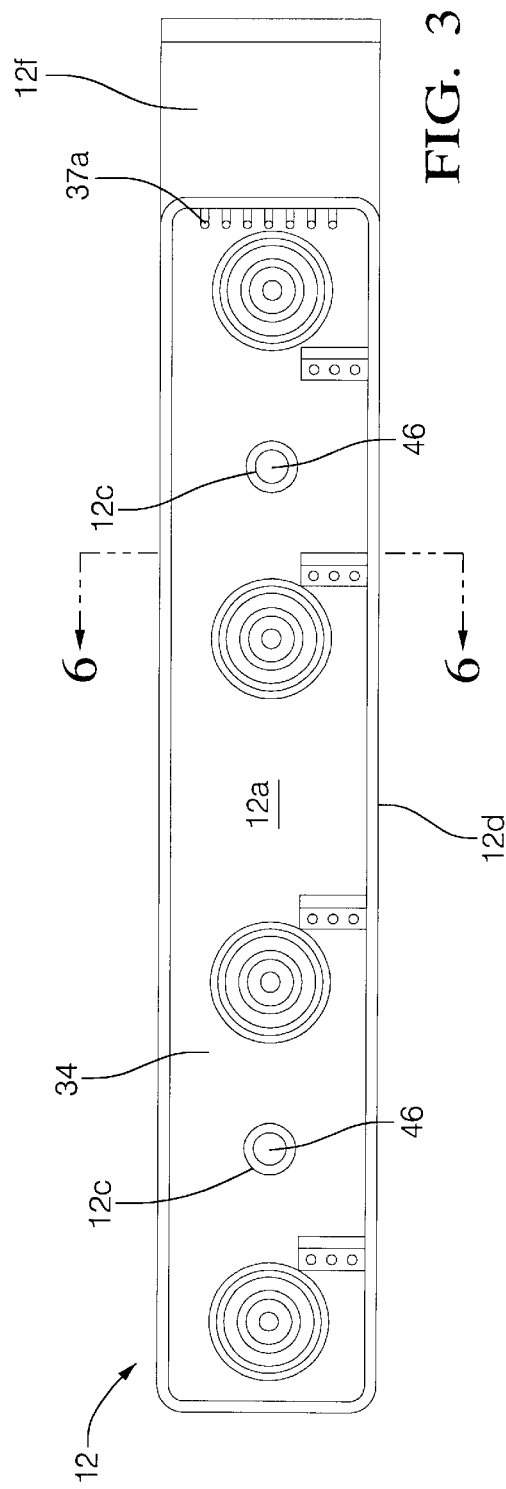

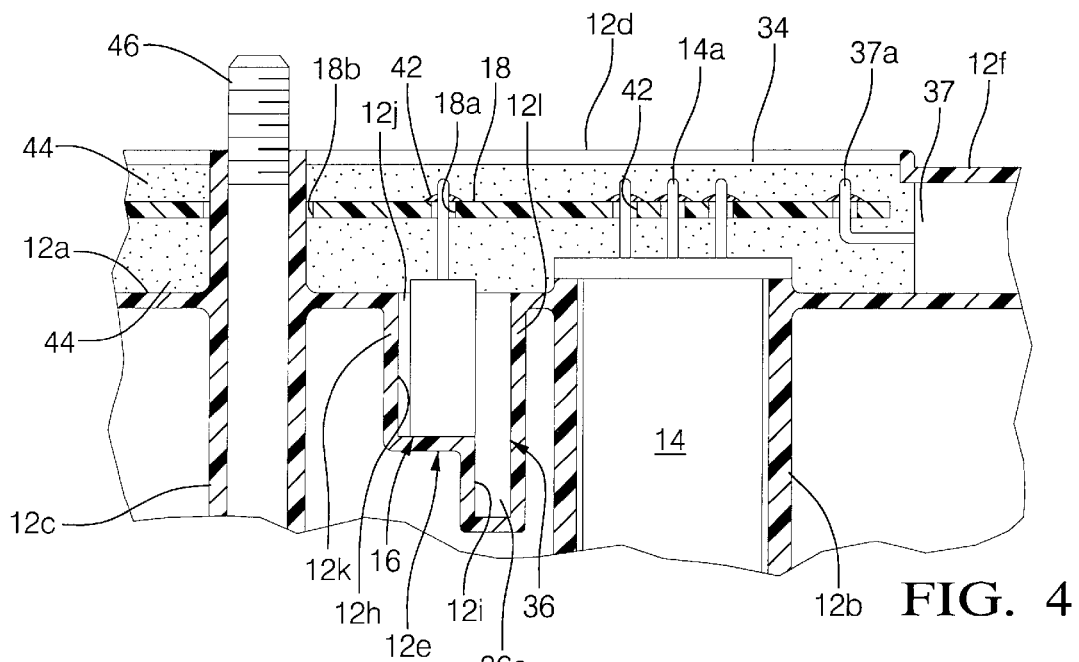
FIG. 4
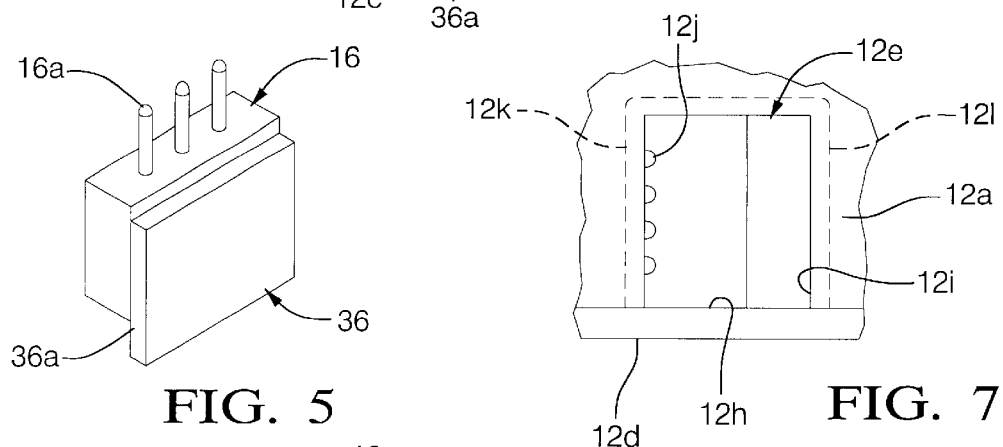
FIG. 5
FIG. 7
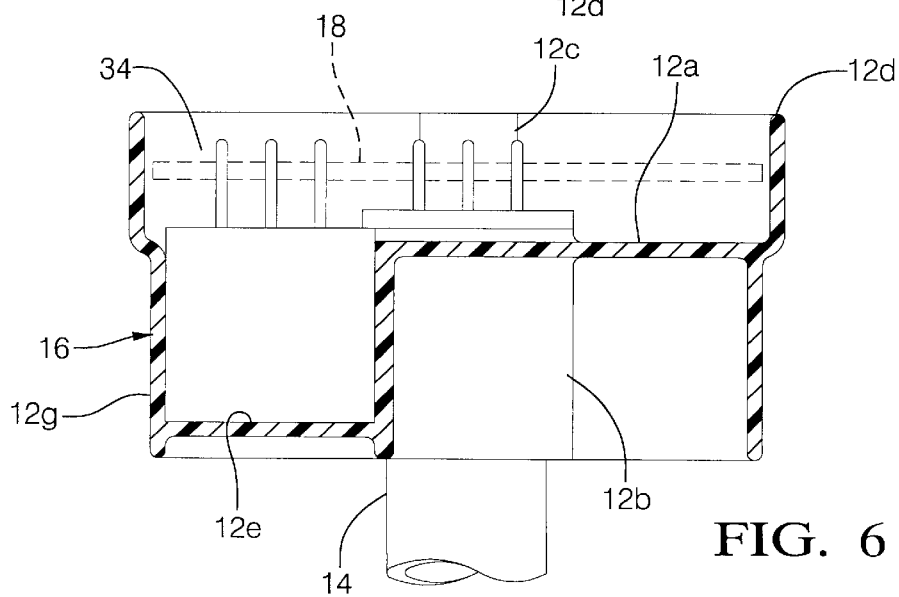
FIG. 6

IGNITION COIL CASSETTE ASSEMBLY

BACKGROUND OF THE INVENTION

This invention relates to ignition coils and more particularly to ignition coils arranged in a cassette format.

The ignition of the fuel-air mixture in the combustion chamber of an internal combustion engine is done by a sparkplug in which a high voltage spark generated by a coil causes a discharge across a firing or spark gap of the sparkplug. The ignition coil itself is charged with energy and discharges at a predetermined time, which may be controlled by a computer. The coil discharge causes the spark to flash over at the spark gap and the spark gap ignites the combustion mixture within the combustion chamber of the internal combustion engine. Whereas a single coil has traditionally been used to control the discharge of a plurality of spark plugs, more recently systems have been employed in which a separate coil is provided for each sparkplug. A typical system includes a coil for each cylinder or spark plug, a coil driver for each coil, one or more crankshaft position sensors, and a camshaft position sensor. The coils can be mounted as inductive coil per cylinder systems or integrated into cassettes.

Highest efficiency and lowest electromagnetic radiation is attained by integrating the coils into cassettes specifically designed for the engine and located just above the spark plugs. The ignition cassette is typically installed in the cylinder head valve cover and each ignition coil is connected directly to its corresponding sparkplug by a secondary boot and spring so there is no need for secondary leads. Because the secondary leads are eliminated and all of the ignition components of the system are contained in a single cassette for each cylinder bank, installation of the ignition system onto the engine is simplified.

Whereas the ignition cassette arrangement has proven to be generally satisfactory, the assembly of the cassette is rather complicated and somewhat labor intensive. There is accordingly a need to simplify the construction and assembly of the ignition cassette system.

SUMMARY OF THE INVENTION

This invention is directed to ignition coil cassette assemblies.

More specifically, this invention is directed to an ignition coil cassette assembly which may be manufactured at lower cost and which provides minimal thermal resistance.

The methodology aspect of the invention concerns a method of assembly an ignition coil cassette assembly for use with an internal combustion engine having a plurality of cylinder assemblies each including a spark plug. The cassette assembly includes a plurality of ignition coils for respective electrical coupling to the respective spark plugs to deliver high voltage charges to the spark plugs in accordance with a predetermined firing order, a cassette body structure interconnecting and mounting the ignition coils in spaced downstanding relation with respect to the body, and a printed circuit board for delivering power to the coils and including electronic components mounted on the board.

According to the invention methodology, a plurality of upwardly opening pockets are provided in the cassette body; the electric components are positioned in the pockets; the ignition coils are positioned in the cassette body; the printed circuit board is positioned in overlying relation to the electronic components and upper ends of the ignition coils; and upstanding pins on the electronic components are soldered to the printed circuit board while simultaneously soldering upstanding pins on the upper ends of the ignition coils to the printed circuit board. This methodology allows the electronic components to be soldered to the printed circuit board in the same wave soldering operation utilized to solder the coils to the printed circuit board.

According to a further feature of the invention methodology, the method includes the further step of encapsulating the printed circuit board in an epoxy material following soldering of the electronic component and the ignition coil pins to the printed circuit board. This methodology facilitates the insulative packaging of the cassette.

According to a further feature of the invention methodology, an upper face of the cassette body has an upwardly opening bathtub configuration overlying the upper ends of the ignition coils, and the printed circuit board is positioned in the bathtub configuration in overlying relation to the ignition coils. This methodology provides a convenient means of positively positioning and packaging the circuit board to the cassette body.

According to a further feature of the invention methodology, the epoxy material is poured into the bathtub configuration following positioning of the printed circuit board in the bathtub configuration and soldering of the electronic component pins and the ignition coil pins to the printed circuit board. With this methodology, the bathtub configuration of the cassette body serves to contain and define the extent of the epoxy material.

According to a further feature of the invention methodology, the electronic components comprise drivers for the respective coils; each driver includes a heatsink element; and the pockets are configured to tightly receive the drivers and included heatsink elements. This methodology facilitates the secure placement of the drivers in the cassette body and facilitates heat dissipation.

According to a further feature of the invention methodology, each pocket, in cross-section, includes an upper main body upwardly opening portion sized to tightly receive the driver and heatsink element and a lower portion sized to tightly receive a tab portion of the respective heatsink element extending below the associated driver. This methodology positively locates the driver in the cassette body and minimizes the resistance between the driver and ambient whereby to facilitate heat dissipation.

According to a further feature of the invention methodology, the upper main body portion of each pocket includes crush ribs which operate in response to insertion of a driver and associated heatsink element into the pocket to push the heatsink element against an opposite wall of the pocket. This methodology insures a tight fit between the heatsink element and the confronting wall of the pocket whereby to further minimize thermal resistance between the driver and ambient.

According to a further feature of the invention methodology, the pockets are defined by thin walls of the cassette body whereby to further facilitate heat dissipation.

According to an apparatus aspect of the invention, an ignition coil assembly is provided for use with an internal combustion engine having a plurality of cylinder assemblies each including a spark plug, the cassette assembly including a plurality of ignition coils for respective electrical coupling to the respective power plugs, whereby to deliver high voltage charges to the spark plugs in accordance with a predetermined firing order, a cassette body structure interconnecting and mounting the ignition coils in spaced downstanding relation with respect to the body, and a printed circuit board for delivering power to the coils and including electronic components mounted on the board.

According to the invention apparatus, a plurality of upwardly opening pockets are provided in the cassette body; the electronic components are positioned in the pockets and include upstanding pins; and the printed circuit board is positioned in overlying relation to the electronic components and upper ends of the ignition coils with the upstanding pins on the electronic components and upstanding pins on the ignition coils extending upwardly through openings in the printed circuit board for soldering connection to the printed circuit board. This construction facilitates the attachment of the electronic components to the printed circuit board and specifically allows the electronic components to be soldered to the printed circuit board in the same wave soldering operation that solders the coils to the printed circuit board.

According to a further feature of the invention apparatus, the printed circuit board and the electronic components are encapsulated in an epoxy material. This arrangement provides a convenient and effective insulator packaging for the cassette assembly.

According to a further feature of the invention apparatus, an upper face of the cassette body has an upwardly opening bathtub configuration overlying the upper ends of the ignition coils and the printed circuit board is positioned in the bathtub configuration in overlying relation to the ignition coils. This arrangement provides a convenient packaging for the printed circuit board with respect to the cassette body.

According to a further feature of the invention apparatus, the epoxy material is contained in the bathtub configuration in surrounding relation to the printed circuit board. This arrangement facilitates the containment and the definition of the epoxy material.

According to a further feature of the invention apparatus, each ignition coil comprises a pencil coil having a core, secondary winding, and primary winding arranged in concentric relation. The use of pencil coils facilitates the use of the cassette configuration.

According to a further feature of the invention apparatus, the electronic components comprise drivers for the respective coils, each driver includes a heatsink element, and the pockets are configured to tightly receive the drivers and included heatsink elements. This specific pocket construction facilitates the mounting of the drivers in the cassette body.

According to a further feature of the invention apparatus, each pocket, in cross-section, includes an upper main body upwardly opening portion sized to receive the driver and heatsink element and a lower portion sized to tightly receive a tab portion of the respective heatsink element extending below the associated driver. This specific pocket configuration facilitates the mounting of the drivers in the cassette body and optimizes the heat dissipation from the drivers.

According to a further feature of the invention apparatus, the upper main body portion of each pocket includes crush ribs which operate in response to insertion of the driver and associated heatsink element into the pocket to push the heatsink element against an opposite wall of the pocket. This arrangement further facilitates the heat dissipation from the drivers.

According to a further feature of the invention apparatus, the pockets are defined by thin walls of the cassette body. This arrangement further facilitates heat dissipation.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 2 is an elevational partially fragmentary view of the ignition coil cassette;

FIG. 3 is a plan view of the ignition coil cassette;

FIG. 4 is a detail view of a portion of the ignition coil cassette;

FIG. 5 is a perspective view of a driver and heatsink utilized in the cassette assembly;

FIG. 6 is a cross-sectional view taken on line 6—6 of FIG. 3; and

FIG. 7 is a fragmentary top view showing a pocket provided in the cassette body.

DESCRIPTION OF THE PREFERRED EMBODIMENT

Figure 1:
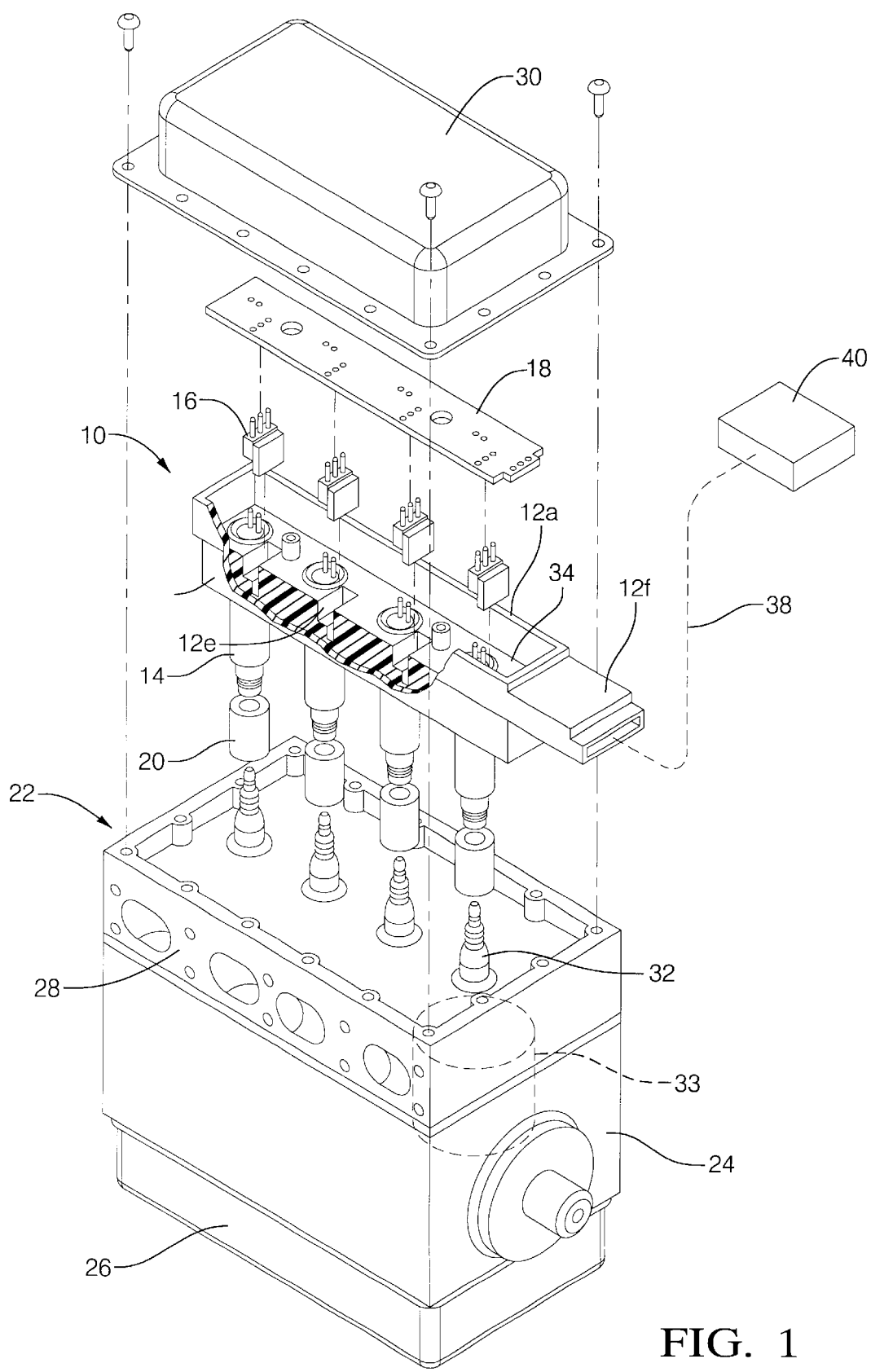
FIG. 1 is a schematic exploded perspective view showing an ignition cassette assembly according to the invention in association with a schematically shown internal combustion engine.

The ignition coil cassette assembly 10 according to the invention, broadly considered, includes a cassette body 12, a plurality of ignition coils 14, a plurality of electronic components 16, a printed circuit board (PCB) 18, and a plurality of boots 20.

Ignition coil assembly 10 is seen in FIG. 1 in association with a schematically shown engine 22 including a block 24, an oil pan 26, a head 28, a valve cover 30 and spark plugs 32 mounted in the head 28 in known manner for coaction with individual cylinder assemblies 33 of the engine. In broad overview, ignition coil assembly 10 is mounted in the valve cover 30 and, with the valve cover 30 assembled to the head 28, the coils 14 project downwardly from the cassette body 12 for connection via boots 20 to the respective spark plugs 32.

Cassette body 12 is formed of a plastic or other suitable insulative material in a suitable molding operation and includes a floor portion 12a, a plurality of cylindrical socket portions 12b downstanding in spaced relation from floor portion 12a, a plurality of fastener columns 12c upstanding and downstanding from floor 12a, a perimeter wall or lip portion 12d upstanding from and surrounding floor portion 12a and coacting with floor portion 12a to define a bathtub configuration or cavity 34 proximate the upper face of the cassette body 12, a plurality of pockets 12e positioned in spaced relation along one sidewall of the cassette body 12 and opening upwardly into the cavity 34 within perimeter wall 12d, a connector body portion 12f at one end of the cassette body 12, and a skirt portion 12g extending downwardly from the floor 12a in surrounding relation to sockets 12b, columns 12c and pockets 12e. Cassette body 12 will be seen to have a thin wall configuration rather than a solid block configuration to facilitate heat dissipation. Each pocket 12e is sized to receive an electronic component 16 and includes an upper main body upwardly opening portion 12h, a lower narrow portion 12i extending downwardly from upper portion 12h, and a plurality of laterally spaced vertical crush ribs 12j provided on a first wall 12k of the pocket 12e in confronting relation to an opposite second wall 12l of the pocket 12e. A pocket 12a is provided proximate each socket portion 12b.

Each ignition coil 14 is positioned in a socket portion 12b of the cassette body 12 with connector pins 14a upstanding from the upper end of the ignition coil 14 into cavity 34. The ignition coils 14 are preferably of the "pencil" type including a core, secondary winding, and primary winding arranged in concentric relation. A pencil coil suitable for use in the invention ignition coil cassette assembly is disclosed, for example, in U.S. Pat. No. 6,276,348 assigned to the assignee of the present application.

Electronic components 16 may comprise, for example, drivers for the ignition coils 14. A heatsink 36 is secured to one face of each driver 16 and includes a lower tab portion 36a extending below the driver 16 and sized to fit in the lower portion 12i of a respective pocket 12e. Driver 16 in known manner includes a plurality of upstanding connector pins 16a. A driver 16 will be seen to be provided in association with and adjacent to each ignition coil 14.

PCB 18 is of known form and is sized to fit in the cavity or bathtub 34 defined by the perimeter wall 12a of the cassette body 12 in overlying relation to the ignition coils 14 and the drivers 16. It will be understood that the PCB 18 will also include suitable openings 18a for passage of the connector pins 16a of the drivers 16 and 14a of the ignition coils 14 as well as for passage of the terminals 37a of a lead frame 37 suitably positioned in the connector body 12f of the cassette body 12 and arranged in known manner for electrical connection to a wiring harness 38 communicating with an engine electronic control module (ECM) 40. ECM 40 receives, in known manner, various engine control parameters including control signals from the engine crankshaft and the engine camshaft indicative of the instantaneous position of the various cylinders of the engine.

To assemble the ignition coil cassette of the invention, ignition coils 14 are positioned in the sockets 12b and drivers 16 are positioned in the pockets 12e. The upper portion 12h of each pocket 12e is sized such that the combined thickness of a driver 16 and a heatsink 36 provides a tight press fit into the pocket with the tab portion 36a of the heatsink 36 seating tightly in the lower portion 12i of the pocket 12e and with the crush ribs 12j pressing against one face of the driver 16 to press the exposed face of the heatsink 36 against the opposite wall 12l of the pocket 12e to minimize the thermal resistance between the heatsink and ambient. The pocket 12e is also contoured so that the mounting tab portion 36a of the heatsink 36 only has the plastic wall of the pocket 12e between it and ambient on both the front and back faces of the mounting tab portion 36a.

Following the positioning of the ignition coils 14 and drivers 16 in the cassette body 12, the PCB 18 is positioned within the bathtub or cavity 34 in overlying relation to the ignition coils 14 and the drivers 16 as well as in overlying relation to the terminals 36a of the lead frame 37. The PCB 18 is positioned such that the connector pins 16a of the drivers, the connector pins 14a of the ignition coils 14, and the terminals 36a of the lead frame 37 pass upwardly through respective openings 18a in the PCB 18, whereafter pins 16a, pins 14a, and terminals 36a are soldered to the PCB 18 in a single continuous wave soldering operation to form soldering connections 42. Thus, the same assembly step that solders the PCB 18 to the ignition coil pins 14a also solders the PCB 18 to the driver pins 16a. Accordingly, placing the drivers 14 in the pockets 12e in the cassette body 12 is the only added operational step required to add electronics to the cassette assembly 10. Further, it will be seen that the described assembly process involves inserting the pins 14a, 16a through the openings in the PCB 18 vertically so that the pins 14a, 16a do not need to be bent, thereby saving further operational steps.

Following the wave soldering operation, a suitable liquid epoxy material 44 is poured into bathtub cavity 34. The liquid epoxy fills the spaces above and below PCB 18 whereby to completely encapsulate the PCB 18 within cavity 34 and completely encapsulate the various solder connections 42.

The completed ignition coil assembly 10 is secured within the valve cover 30 utilizing suitable fasteners 46 passing upwardly through the columns 12c and in this regard the PCB 18 also includes openings 18b to pass the columns 12c. Once the ignition coil assembly 10 has been fixedly secured within the valve cover 30, the valve cover 30, carrying the ignition coil assembly 10, may be positioned over the engine head 28 and thereby over the respective spark plugs 32 to secure the lower ends of the respective coils 14 to the respective spark plugs 32. This attachment of the lower ends of the coils 14 to the spark plugs 32 is accomplished using the boots 20 and associated springs (not shown) in a manner more fully disclosed in U.S. Pat. No. 6,247,943 assigned to the assignee of the present invention.

The invention methodology and apparatus will be seen to provide many important advantages:

1. Positioning the drivers 16 in pockets 12e provided in the cassette body 12 eliminates the need to separately solder the drivers 16 to the PCB 18 since, with the described arrangement, the drivers 16 may be soldered to the PCB 18 in the same wave soldering step already required to solder the ignition coils 14 to the PCB 18.

2. The connector pins 14a, 16a are inserted vertically through the PCB 18 so that the pins 14a, 16a do not need to be bent, thereby providing further labor savings.

3. The configuration of the cassette body pockets 12e is such that each heatsink 36 is firmly pressed against the back wall of the pocket 12e to minimize the thermal resistance between the heatsink 36 and ambient, and each pocket 12e is also contoured such that the mounting tab portion 36a of the heatsink 36 only has the plastic wall of the pocket 12e between it and ambient on both the front and back of the tab portion 36a of the heatsink 36 to further minimize the thermal resistance between the heatsink 36 and ambient.

4. The described apparatus and methodology allows the electronics required for the cassette assembly 10 to be integrated onto the PCB 18, thereby allowing the use of one pre-packaged control circuit and thereby yielding the minimal electronic content and therefore the minimal cost.

5. The use of a single pre-packaged control circuit pre-assembled onto the PCB 18 and soldered at the same time as the drivers and coils allows the electronics in the pockets to be low cost drivers such as IGBT's or darlingtons.

6. The use of pockets 12e to house the electronic components for the coils lowers the thermal resistance and thereby the efficiencies of the system as compared to a system in which the electronics are integrated into each coil where they are surrounded by a large amount of epoxy material that yields a much higher thermal resistance.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An ignition coil cassette assembly for use with an internal combustion engine having a plurality of cylinder assemblies each including a spark plug, the cassette assembly including a plurality of ignition coils for respective electrical coupling to the respective spark plugs, whereby to deliver high voltage charges to the spark plugs in accordance with a predetermined firing order, a cassette body structure interconnecting and mounting the ignition coils in spaced downstanding relation with respect to the body, a printed circuit board for delivering power to the coils, and electronic components mounted on the board, characterized in that:

a plurality of upwardly opening pockets are provided in the cassette body;

the electronic components are positioned in the pockets and include upstanding pins; and the printed circuit board is positioned in overlying relation to the electronic components and upper ends of the ignition coils with the upstanding pins on the electronic components and upstanding pins on the ignition coils extending upwardly through openings in the printed circuit board for soldering connection to the printed circuit board.

2. An ignition coil cassette assembly according to claim 1 wherein the printed circuit board and the electronic components are encapsulated in an epoxy material.

3. An ignition coil cassette assembly according to claim 2 wherein an upper face of the body has an upwardly opening bathtub configuration overlying the upper ends of the ignition coils and the printed circuit board is positioned in the bathtub configuration in overlying relation to the ignition coils.

4. An ignition coil cassette assembly according to claim 3 wherein the epoxy material is contained in the bathtub configuration in surrounding relation to the printed circuit board.

5. An ignition coil cassette assembly according to claim 1 wherein each ignition coil comprises a pencil coil having a core, secondary winding, and primary winding arranged in concentric relation.

6. An ignition coil cassette assembly according to claim 1 wherein:

the electronic components comprise drivers for the respective coils;

each driver includes a heatsink element; and the pockets are configured to tightly receive the drivers and included heatsink elements.

7. An ignition coil cassette assembly according to claim 6 wherein each pocket, in cross-section, includes an upper main body upwardly opening portion sized to tightly receive the driver and heatsink element and a lower portion sized to tightly receive a tab portion of the respective heatsink element extending below the associated driver.

8. An ignition coil cassette assembly according to claim 7 wherein the upper main body portion of each pocket includes crush ribs which operate in response to insertion of a driver and associated heatsink element into the pocket to push the heatsink element against an opposite wall of the pocket.

9. An ignition coil cassette assembly according to claim 6 wherein the pockets are defined by thin walls of the cassette body whereby to facilitate heat dissipation.

* * * * *